United States Patent
Savoj et al.

(10) Patent No.: US 10,459,478 B1
(45) Date of Patent: Oct. 29, 2019

(54) DIGITAL SENSOR WITH EMBEDDED REFERENCE CLOCK

(71) Applicant: Apple Inc., Cupertino, CA (US)

(72) Inventors: Jafar Savoj, Sunnyvale, CA (US); Amr A. Hafez, Santa Clara, CA (US); Ramy A. Ahmed, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/953,019

(22) Filed: Apr. 13, 2018

(51) Int. Cl.
| | |
|---|---|
| *G01K 13/00* | (2006.01) |
| *G06F 1/10* | (2006.01) |
| *G11C 19/28* | (2006.01) |
| *H03K 3/03* | (2006.01) |
| *G01R 19/165* | (2006.01) |

(52) U.S. Cl.
CPC ............ *G06F 1/10* (2013.01); *G01K 13/00* (2013.01); *G01R 19/165* (2013.01); *G11C 19/28* (2013.01); *H03K 3/0315* (2013.01)

(58) Field of Classification Search
CPC ...... G06F 1/10; G01R 19/165; H03K 3/0315; G01K 13/00; G11C 19/28
See application file for complete search history.

(56) References Cited

U.S. PATENT DOCUMENTS

| | | | |
|---|---|---|---|
| 7,859,421 B2 | 12/2010 | Berthold et al. | |
| 9,077,322 B2 * | 7/2015 | Smith | H03K 3/0322 |
| 9,110,104 B2 | 8/2015 | Chung et al. | |
| 9,714,966 B2 | 7/2017 | Chen et al. | |
| 9,720,033 B2 * | 8/2017 | Savoj | G01R 31/2874 |

\* cited by examiner

*Primary Examiner* — Jung Kim
(74) *Attorney, Agent, or Firm* — Meyertons, Hood, Kivlin, Kowert & Goetzel, P.C.; Erik A. Heter

(57) ABSTRACT

A sensor circuit and integrated circuit having the same is disclosed. In one embodiment, a sensor circuit includes first and second ring oscillators having different circuit topologies. A first counter is coupled to receive an output signal from the first ring oscillator, while a second counter is coupled to receive an output signal from the second ring oscillator. The sensor circuit further includes a local clock circuit that provides a clock signal to the first and second counters. Furthermore, the local clock circuit is coupled to provide the clock signal exclusively to circuitry within the sensor circuit, the circuitry including the first and second counters.

15 Claims, 6 Drawing Sheets

US 10,459,478 B1

DIGITAL SENSOR WITH EMBEDDED REFERENCE CLOCK

BACKGROUND

Technical Field

This disclosure is directed to electronic circuits, and more particularly, to circuits used to sense voltages and temperatures on an integrated circuit.

Description of the Related Art

As features sizes have decreased, the number of transistors on integrated circuits (ICs) has correspondingly increased. The increased number of transistors per unit area has resulted in a corresponding increase in thermal output of ICs. Furthermore, the increased number of transistors per unit area has also corresponded to a decrease in the supply voltages provided to various functional circuitry on an IC. This has in turn led to significant challenges in balancing performance, power consumption, and thermal output of ICs. To this end, many ICs implement subsystems that monitor various metrics of the IC (e.g., temperature, voltage, voltage droops) and adjust the performance based on received measurements. For example, a control subsystem may reduce a clock frequency, supply voltage, or both, responsive to a temperature reading that exceeds a predefined threshold. This may help maintain operation of the IC within specified thermal limits. Such control systems may also boost the performance of certain functional circuits when measured metrics are well within limits.

IC subsystems used to control performance based on system metrics typically include one or more sensors and at least one control system. The sensors may be coupled to receive a power supply from a source separate to other circuitry in the vicinity (e.g., a tightly controlled analog power supply). In addition, some sensors may operate based on a clock signal, provided from a centralized source and distributed throughout the IC to the various sensors.

SUMMARY

A sensor circuit and integrated circuit having the same is disclosed. In one embodiment, a sensor circuit includes first and second ring oscillators having different circuit topologies. A first counter is coupled to receive an output signal from the first ring oscillator, while a second counter is coupled to receive an output signal from the second ring oscillator. The sensor circuit further includes a local clock circuit that provides a clock signal to the first and second counters. Furthermore, the local clock circuit is coupled to provide the clock signal exclusively to circuitry within the sensor circuit.

In one embodiment, an integrated circuit (IC) includes a number of sensors distributed throughout. Each of the sensors is implemented in a functional circuit block of the IC. Furthermore, each of the sensors includes its own clock circuit that generates a clock signal locally, rather than distributing a single clock signal to each of the sensors. The presence of a local clock circuit in each of the sensors eliminates any need to route a signal path for a clock signal to each of the sensor. Additionally, each of the sensors is further coupled to operate using a local supply voltage that is the same supply voltage received by the circuitry of the functional circuit block in which it is implemented.

The local clock circuit may be implemented in any suitable manner. In one embodiment, the clock circuit is implemented as a ring oscillator having different characteristics than the first and second ring oscillators. Irrespective of the type of circuitry used, the local clock circuit may be implemented in close proximity to the counters of the sensor, and thus the path for distribution of the local clock signal is relatively short.

BRIEF DESCRIPTION OF THE DRAWINGS

The following detailed description makes reference to the accompanying drawings, which are now briefly described.

Figure 1:
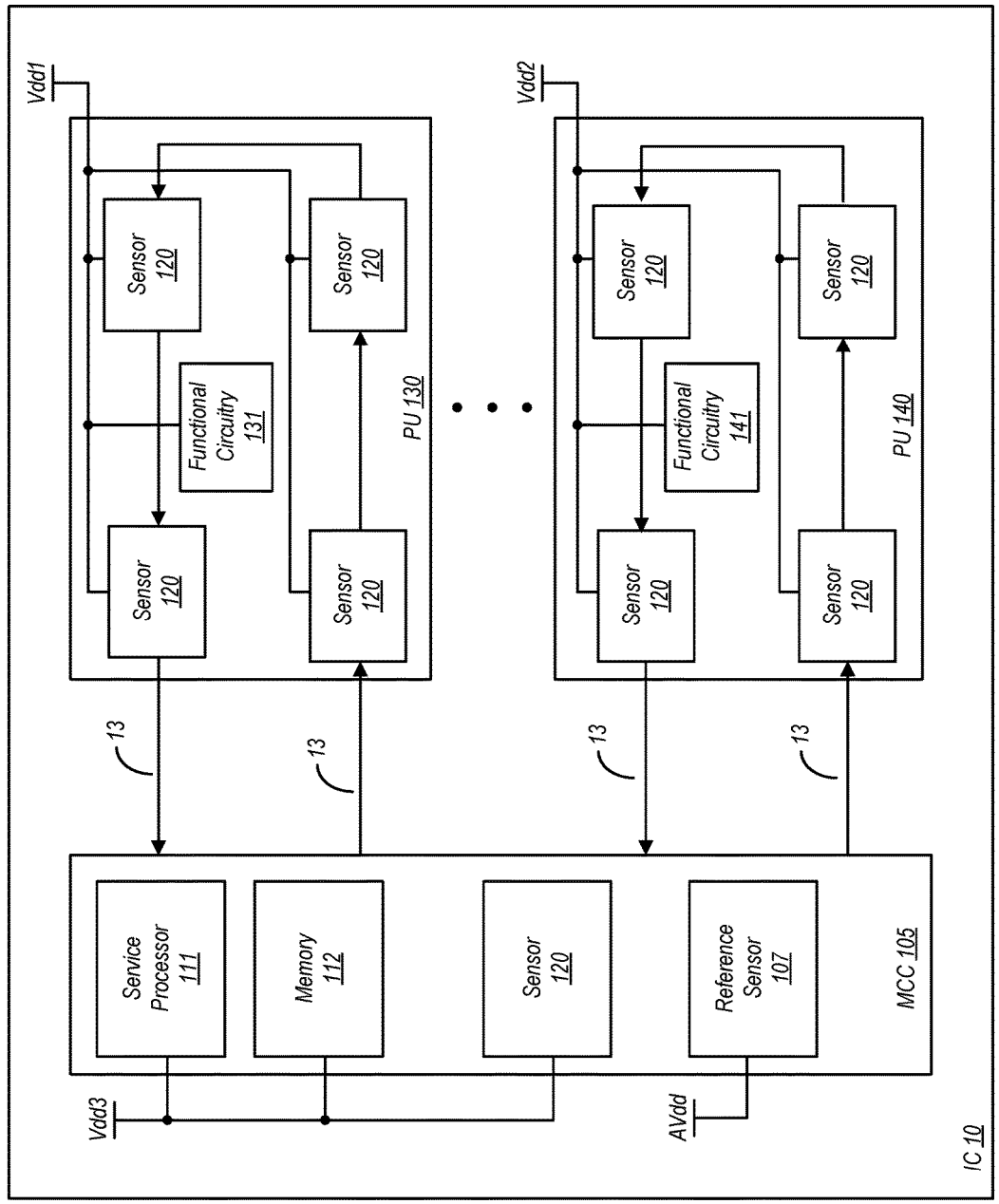
FIG. 1 is a block diagram of one embodiment of an IC.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality, of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Turning now to FIG. 1, a block diagram of one embodiment of an IC is shown. In the embodiment shown, IC 10 includes two functional circuit blocks, processing unit (PU) 130, and PU 140. In various embodiments, other functional circuit blocks may be included, including additional instances of PU 130. PU 130 and PU 140 are thus shown here as exemplary functional circuit blocks, but are not intended to limit the scope of this disclosure. Each of PU 130 and 140 may be a general purpose processor core, a graphics processing unit, a digital signal processing unit, or virtually any other kind of functional unit/circuitry configured to perform a processing function. The scope of this disclosure may apply to any of these types of functional circuit blocks, as well as other not explicitly mentioned herein. The number of functional circuit blocks shown here is by way of example as well, as the disclosure is not limited to any particular number.

PU 130 in the embodiment shown is a general purpose processor core configured to execute the instructions of an instruction set and perform general purpose processing operations. Functional circuitry 131 of PU 130 may thus include various types of circuitry such as execution units of various types (integer, floating point, etc.), register files, schedulers, instruction fetch units, various levels of cache memory, and other circuitry that may be implemented in a processor core. PU 130, and all circuitry therein, is coupled to receive supply voltage Vdd1 in this embodiment. It is noted however that multiple power domains, and thus multiple supply voltages, may be implemented within various embodiments of PU 130. Furthermore, supply voltages provided to PU 130 may be variable under the control of power management circuitry (not shown). The power management circuitry adjusts the voltages for various reasons, such as controlling performance levels, thermal output, and power consumption.

GPU 140 in the illustrated embodiment includes functional circuitry 141, which may implement various types of graphics processing circuitry. This may include graphics processing cores, various types of memory and registers, and so on. GPU 140 in the embodiment shown is coupled to receive a second supply voltage, Vdd2 that is separate from Vdd1 as received by PU 130.

Both PU 130 and PU 140 include a number of sensors 120. The particular number of sensors shown here is for example only, and in actual embodiments may be greater, lesser, or equal. The sensors 120 may be configured for sensing one or more performance metrics, or parameters. In this particular embodiment, the sensors are configured to sense voltage and temperature values. The sensed voltage and temperature values may in turn be used to determine whether or not circuitry implemented therein is operating within limits and/or is capable of higher performance.

Each of the sensors 120 in the embodiment shown is coupled to the same voltage supply as the functional circuitry in its respective one of the functional circuit blocks. That is, each sensor 120 in PU 130 is coupled to receive a supply voltage Vdd1, while each sensor in GPU 140 is coupled to receive Vdd2. In prior art embodiments, such sensors are typically coupled to receive power from a supply separate from that of the functional circuitry near which they are implemented. This may limit their placement within an IC/functional circuit block due to the need to route connections for another voltage supply. Furthermore, the sensors in prior art embodiments may typically be larger than those used in the embodiments discussed herein, which may further limit their number and placement. In contrast, the sensors 120 implemented herein may be simplified sensors. Accordingly, sensors 120 may be smaller than prior art sensors. This in turn may allow more sensors to be placed on an IC. Furthermore, the sensors may be placed in smaller areas, increasing the versatility of their implementation. In one embodiment, sensors 120 may be implemented using one or more ring oscillators. However, since the frequency produced by a ring oscillator may show a significant dependence on process, voltage, and temperature variations, the ring oscillators may be calibrated such that these dependencies do not adversely affect their accuracy. Various calibration and operation methodologies are discussed in further detail below. It is noted that an initial calibration (and characterizations) for each sensor may be performed during a test using automated test equipment (ATE) at known voltages and temperatures. Subsequent calibrations may be performed during startup and/or operation of the system in which IC 10 is implemented.

Each of sensors 120 also includes its own local clock circuit, as is discussed below. Including a local clock circuit within each sensor 120 may allow for additional flexibility in their placement on IC 10. In contrast to embodiments in which a clock signal is provided from an external source to each sensor 120, inclusion of the local clock circuit eliminates the need to route connections from the external source to the various sensors. Furthermore, by making each of sensors 120 reliant on a locally supplied voltage and a locally generated clock signal, the ability to tamper with the voltage and clock signals provided to the sensors is significantly reduced.

IC 10 in the embodiment shown includes metrology control circuitry (MCC) 105. MCC 105 may perform various operations involved with operation of the sensors 120 in the various functional circuit blocks of IC 10. In the embodiment shown, MCC 105 is coupled to each of the sensors 120 via a metrology bus 13. During operation of IC 10, each of the sensors 120 may perform readings of, e.g., a frequency of their respective ring oscillator(s), convert the frequency reading into a digital format, and transmit that information to MCC 105. In this embodiment, MCC 105 is a serial bus, and information may be shifted on the bus in operation that is similar to that of a scan chain. However, embodiments utilizing different mechanisms for communications with the sensors are possible and contemplated.

MCC 105 may receive the frequency information from each of the sensors via their correspondingly coupled instances of metrology bus 13. Using the frequency information, MCC 105 may determine a voltage and temperature sensed by each of sensors 120. In the embodiment shown, MCC 105 includes a service processor 111 and a memory 112. Service processor 111 may execute instructions of a software routine to solve for voltage and temperature values based on frequency information received from each of the sensors 120. Embodiments in which dedicated circuitry performs these task in lieu of the execution of software instructions are also possible and contemplated. Memory 112 may be used by service processor to store various information, including the frequency information received from the sensors, the determined voltage and temperature information, and intermediate information generated during the performance of calculations. Memory 112 may also store information characterizing the sensors and the circuitry therein (e.g., the ring oscillators). Memory 112 may be implemented using volatile memory, non-volatile memory, or a combination thereof.

MCC 105 also includes an instance of a sensor 120, as well as a reference sensor 107. Sensor 120 of MCC 105 is coupled to receive supply voltage Vdd3, (as are service processor 111 and memory 112). Furthermore, sensor 120 may be configured in accordance with the other instances of sensor 120 implemented on IC 10. Reference sensor 107 may receive its supply voltage from an analog voltage supply, AVdd. Reference sensor 107 in the embodiment shown may be a high accuracy sensor that is less susceptible to process, voltage, and temperature variations. Temperature readings from reference sensor 107 may be used as a reference during calibrations, or may be used to determine when recalibrations may be necessary.

Figure 2:
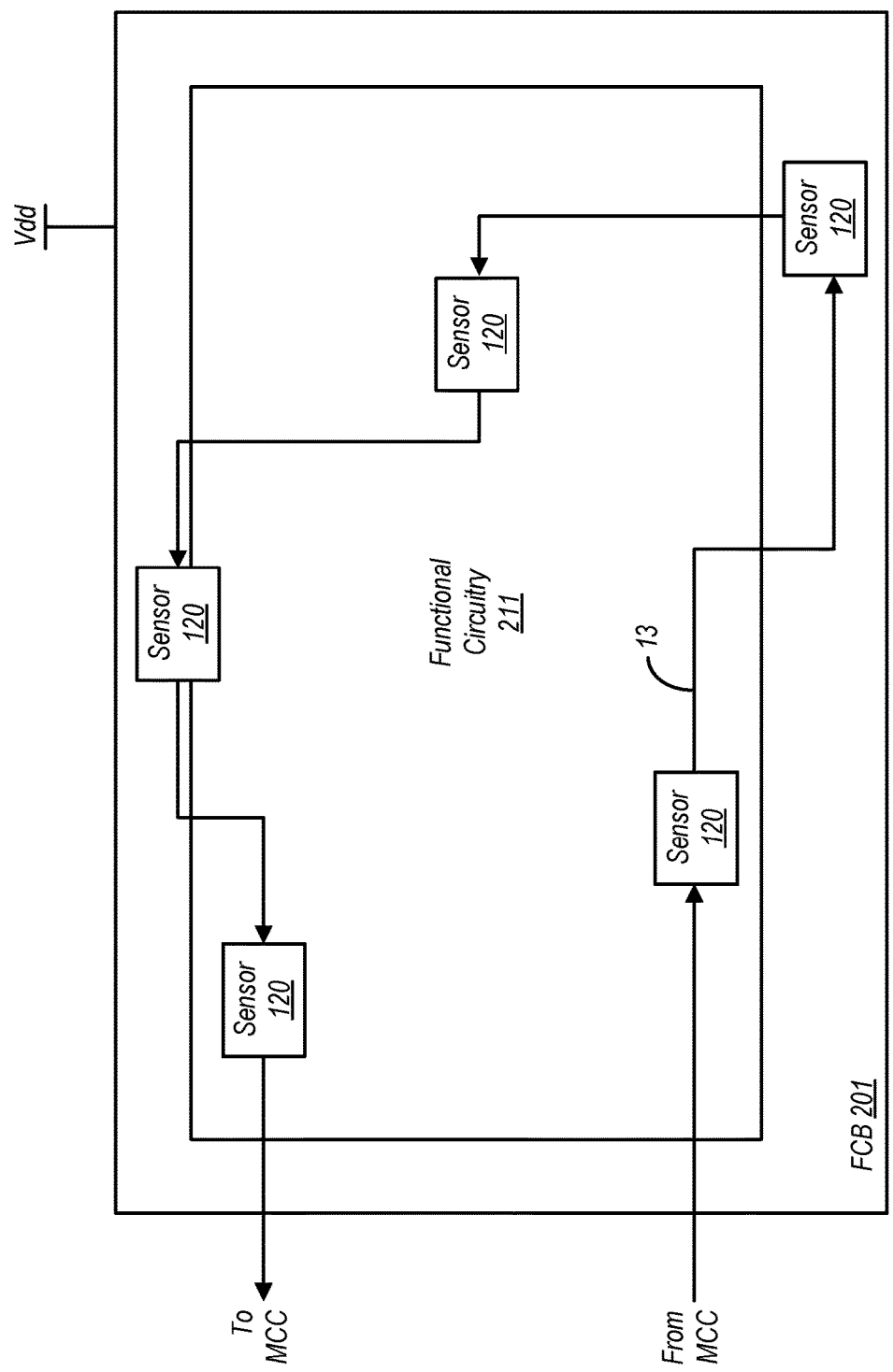
FIG. 2 is a block diagram of one embodiment of a functional circuit block having a number of sensors.

FIG. 2 is a block diagram of one embodiment of a functional circuit block having a number of sensors 120. In the embodiment shown, functional circuit block (FCB) 211 may be virtually any type of functional circuitry implemented on an IC. Included in functional circuitry 211 may be digital circuits, analog circuits, and/or mixed signal circuits. Sensors 120 of FCB 211 are implemented in various places in and around functional circuitry 211. Due to their relatively small footprint, at least some sensors 120 may be implemented within the area otherwise occupied by functional circuit 211, while others may be implemented near or partially within. The sensors 120 in this embodiment are coupled in a series configuration by metrology bus 13, through which data (e.g., frequency data for ring oscillators) may be shifted. Each of the sensors 120 in the embodiment shown is coupled to receive the same supply voltage, Vdd, as received by the functional circuitry 211.

Figure 3:
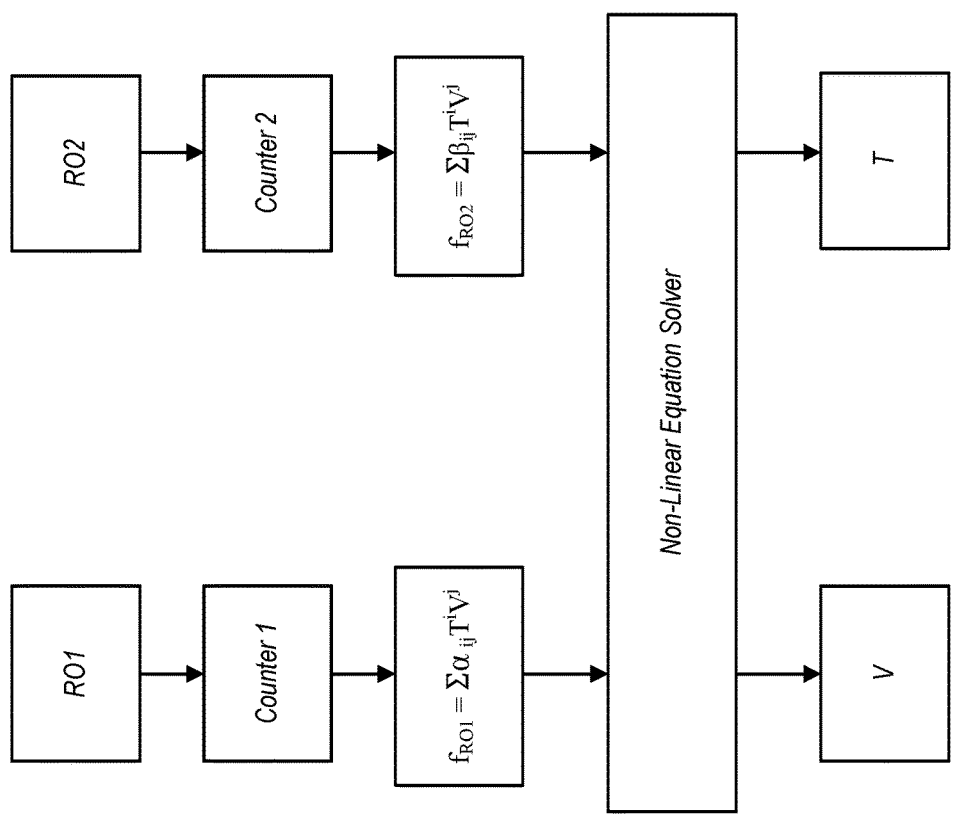
FIG. 3 is a block diagram illustrating an operational concept for an embodiment of a sensor employing two ring oscillators.

FIG. 3 is a block diagram illustrating an operational concept for an embodiment of a sensor employing two ring oscillators. In some embodiment, each sensor included two ring oscillators that are designed to have characteristics different from one another. More particularly, output signal frequencies of each of the ring oscillators RO1 and RO2 may have respective relationships to voltage and temperature that are different from one another. For example, the frequency of an output signal of RO1 may vary more with voltage than with temperature, while the frequency of the output signal of RO2 may vary more with temperature than with voltage. Furthermore, to provide another example, the frequency of the RO1 output signal may vary more with voltage than the frequency of the RO2 output signal, while the frequency of the RO2 output signal may vary more with temperature than that of the RO1 output signal. Generally speaking, one of the ring oscillators may be more sensitive to voltage variations with respect to the other, while the other ring oscillator may be more sensitive to temperature variations.

The two ring oscillators may be implemented in close proximity to one another, and thus may operate under substantially the same voltage and temperature conditions. However, since their characteristics are different from one another, the two ring oscillators may operate at different frequencies under the same voltage and temperature conditions. This principle may enable the determination of voltage and temperature at the sensor using frequency readings from each of the ring oscillators.

In the illustrated example, two ring oscillators, RO1 and RO2 are coupled to Counter 1 and Counter 2, respectively. In taking a reading, each ring oscillator may be allowed to toggle its respectively coupled counter for a predetermined amount of time. After the predetermined time has elapsed, the counters may be frozen and their count values provided to indicate frequency.

Each of the ring oscillators RO1 and RO2 may be characterized by a polynomial. More particularly, the frequency output by each ring oscillator may be characterized by a nonlinear function of voltage and temperature in a form given as shown in Equation 1:

$$f_{RO} = \Sigma \alpha_{ij} T^i V^j \qquad (1)$$

Thus, the frequency of RO1 may be characterized as:

$$f_{RO1} = \Sigma \alpha_{ij} T^i V^j \qquad (2),$$

while the frequency of RO2 may be characterized as:

$$f_{RO2} = \Sigma \beta_{ij} T^i V^j \quad (3).$$

The 'f' terms in the above equations may represent frequency, or alternatively, may represent a ratio of a product of the oscillating frequency and the number of phases to a reference frequency. The determination of the number of terms in this expression corresponding to a given ring oscillator is dependent on its characteristics. In general, a higher number of nonlinear terms increases the accuracy of representing the ring oscillator frequency with polynomials.

The output frequencies (or the product mentioned above) may be provided to a non-linear equation solver. Using the polynomials characterizing the ring oscillators, the simultaneous equations may be solved for both voltage and temperature as detected by the sensor. In one embodiment, the non-linear equation solver may be implemented using the service processor 111 (of FIG. 1) and software instructions executed thereby. More generally, the non-linear equation solver may be implemented using hardware, software, firmware, and any combination thereof. Moreover, it is possible and contemplated in some embodiments that the solving of the non-linear equations may be performed locally in the corresponding functional circuit blocks.

The coefficients in the equations above may be calculated based on actual ring oscillator frequencies for a given set of voltage and temperature values. Consider a model of a ring oscillator in which the frequency is defined using a 9-term function a set of 24 data points (voltage, temperature, and output frequency) used to calculate the ring oscillator characteristics. If a higher number of data points is used to determine coefficients, the resulting function may better characterize the corresponding ring oscillator. This technique may be referred to as surface fitting of the ring oscillator characteristic, and may use numerical techniques to map a large set of data points to a polynomial.

As an example, consider a frequency of a ring oscillator as being defined by the following expression:

$$f_{RO} = \alpha_{22}T^2V^2 + \alpha_{21}T^2V^1 + \alpha_{20}T^2V^0 + \alpha_{12}T^1V^2 + \alpha_{11}T^1V^1 + \alpha_{10}T^1V^0 + \alpha_{02}T^0V^2 + \alpha_{01}T^0V^1 + \alpha_{00}T^0V^0 \quad (4)$$

If measurements of ring oscillator frequency occur at $$\{(f_0, V_0, T_0), (f_1, V_1, T_1), \ldots, (f_{23}, V_{23}, T_{23})\},$$

then the following matrices can be formed:

$$F = [f_0 f_1 \ldots f_{23}] \quad (5)$$

$$A = [\alpha_{22}\alpha_{21}\alpha_{20}\alpha_{12}\alpha_{11}\alpha_{10}\alpha_{02}\alpha_{01}\alpha_{00}] \quad (6)$$

$$X = [X_0 \ldots X_{23}],$$

in which $X_j =$
$$[T_j^2V_j^2 T_j^2V_j^1 T_j^2V_j^0 T_j^1V_j^2 T_j^1V_j^1 T_j^1V_j^0 T_j^0V_j^2 T_j^0V_j^1 T_j^0V_j^0]^T \quad (7).$$

Accordingly, the frequency F can be defined as $F = AX$ (8). The term A can be solved for using Least Squares Estimation, computing all the coefficients in the original surface fit.

This concept can be expanded to two ring oscillators that have a different set of characteristics by characterizing each as described above. Accordingly, two ring oscillators placed in close proximity to one another, receiving the same supply voltage, and operating at substantially the same local temperature, can be characterized in two expressions as follows:

$$\begin{cases} f_{RO1} = \sum_{i,j} \alpha_{ij} T^i V^j \\ f_{RO2} = \sum_{i,j} \beta_{ij} T^i V^j \end{cases} \quad (9)$$

The above assumes that the two ring oscillators are characterized with polynomials having equal lengths, although this is not necessarily required for all instances.

The complexity of solving the simultaneous equations above may be reduced using a piecewise linear (PWL) technique. Using this technique, a two-dimensional nonlinear surface for the output frequency of a ring oscillator can be described using a set of PWL functions. The surface of operation over an entire voltage and temperature can be split into multiple triangular regions over each of which the characteristics of a corresponding can be described using a linear function of voltage and temperature. Thus, the overall surface may be broken into an integer number n of PWL regions, described as follows:

$$f = \begin{cases} a_{T1}T + a_{V1}V + a_{C1} & \text{for region 1} \\ a_{T2}T + a_{V2}V + a_{C2} & \text{for region 2} \\ \vdots \\ a_{Tn}T + a_{Vn}V + a_{Cn} & \text{for region } n \end{cases} \quad (10)$$

The coefficients for each of the PWL functions can be determined using the output frequencies at the three vertices of the triangle describing any given area. For example, for PWL function describing a triangle extending between temperatures T1 and T2 on a first axis and a voltages V1 and V2 on a second axis, with the frequencies measured at $(T_1, V_1)$, $(T_1, V_2)$, and $(T_2, V_1)$ respectively given by $f_1$, $f_2$, and $f_3$ and the index for the PWL is given as i, the following set of equations can be solved in order to compute the coefficients for the corresponding PWL function in that area:

$$\begin{cases} f_1 = a_{Ti}T_1 + a_{Vi}V_1 + a_{Ci} \\ f_2 = a_{Ti}T_1 + a_{Vi}V_2 + a_{Ci} \\ f_3 = a_{Ti}T_2 + a_{Vi}V_1 + a_{Ci} \end{cases} \quad (11)$$

This can be repeated for every region to determine its PWL characteristic, and thus to determine the surface of operation for the ring oscillator.

Once both ring oscillators have been characterized with a set of PWL function, solving the set of nonlinear equations is reduced to solving a set of PWL equations. The equations to be solved for each PWL computation may be generally described as follows:

$$\begin{cases} f_{RO1} = a_{Ti}T + a_{Vi}V + a_{Ci} \\ f_{RO2} = b_{Ti}T + b_{Vi}V + b_{Ci} \end{cases} \quad (12)$$

Solving these two equations for temperature, T, and voltage, V, results in the following:

$$\begin{cases} T = \dfrac{(f_{RO1} - a_{Ci})b_{Vi} - (f_{RO2} - b_{Ci})a_{Vi}}{a_{Ti}b_{Vi} - b_{Ti}a_{Vi}} = f_{RO1}\left(\dfrac{b_{Vi}}{a_{Ti}b_{Vi} - b_{Ti}a_{Vi}}\right) + \\ \qquad f_{RO2}\left(\dfrac{-a_{Vi}}{a_{Ti}b_{Vi} - b_{Ti}a_{Vi}}\right) + \left(\dfrac{a_{Vi}b_{Ci} - b_{Vi}a_{Ci}}{a_{Ti}b_{Vi} - b_{Ti}a_{Vi}}\right) \\ V = -\dfrac{(f_{RO1} - a_{Ci})b_{Ti} - (f_{RO2} - b_{Ci})a_{Ti}}{a_{Ti}b_{Vi} - b_{Ti}a_{Vi}} = f_{RO1}\left(\dfrac{-b_{Ti}}{a_{Ti}b_{Vi} - b_{Ti}a_{Vi}}\right) + \\ \qquad f_{RO2}\left(\dfrac{a_{Ti}}{a_{Ti}b_{Vi} - b_{Ti}a_{Vi}}\right) + \left(-\dfrac{a_{Ti}b_{Ci} - b_{Ti}a_{Ci}}{a_{Ti}b_{Vi} - b_{Ti}a_{Vi}}\right) \end{cases} \quad (13), (14)$$

As previously noted, the calculations discussed herein may be performed in MCC 105, and particularly in service processor 111. This may allow each sensor 120 to be implemented in a small area and limit its power consumption, since it need not perform any conversion of frequency to voltage and/or temperature. More generally, the features used for frequency measurement may be implemented within each sensor 120, while those features used for PWL computation, calibration against process variation, again, and accuracy may be implemented within MCC 105.

A surface fit of each ring oscillator (and thus its respective PWL representation) may change over each process corner and may also be subject to local on-die variations. Moreover, the accuracy of a given ring oscillator may be reduced due to effects such as aging. Accordingly, a calibration scheme used for such ring oscillators may update the characteristics of each. These characteristics may be updated based on a limited set of accurate measurements from each ring oscillator. If an original (but not accurate) model for a given ring oscillator is $$f_{RO\_precal} = \Sigma_{i,j} \alpha_{ij} T^i V^j \quad (15),$$

a set of actual measurements may be performed to update the coefficients such that a more accurate model of the ring oscillator is as follows:

$$f_{RO\_postcal} = \Sigma_{i,j} \alpha^*_{ij} T^i V^j \quad (16).$$

This calibration factors in both the original model and a set of calibration points. As the number of points increases, the accuracy increases correspondingly. Conversely, the efficiency of a calibration algorithm may be determined by the accuracy of the post-calibration model based on a smallest number of data points.

In one embodiment, a calibration algorithm in accordance with the disclosure includes updating the coefficients using a scaled value of the error signal at any calibration point. For any of the calibration points, the error signal (e) may be defined as the difference between the actual measurement and the value predicted by the model. That means $\forall k \in \{1, 2, \ldots, m\}$:

$$e_k = f_k - \Sigma_{i,j} \alpha_{ij} T_k^i V_k^j \quad (17).$$

If the coefficients in the original model ($\alpha_{ij}$) are consolidated in a vector given as $A_0$, a recursive approach may be utilized in which the vector is updated for every single calibration point:

$$A_k = A_{k-1} + e_k G \quad (18).$$

In one embodiment, the G vector may be determined using the Recursive Least Squares (RLS) technique. This may in turn result in a relatively fast convergence to final desired values based on a limited set of calibration data. In using the RLS technique, the G vector is recursively updated during each step. The RLS technique may utilize an alternate characterization of a ring oscillator as follows:

$$f_{RO\_precal} = A_0 U^T \quad (19),$$

wherein U is a vector of the (i+1)(j+1) terms, i.e.:

$$U = [T^i V^j T^{i-1} V^j \ldots T^0 V^0] \quad (20).$$

From this, a diagonal matrix may be formed:

$$P_0 = \begin{bmatrix} \text{var}(U(1))^{-1} & 0 & & \\ 0 & \text{var}(U(2))^{-1} & \ldots & 0 \\ \vdots & & \ddots & \vdots \\ 0 & & \ldots & dc \end{bmatrix} \quad (21)$$

For any calibration point, the following set of computations may be performed:

$$\begin{cases} r_k = \lambda + U P_{k-1} U^T \\ G_k = \dfrac{1}{r_k} P_{k-1} U^T \\ A_k = A_{k-1} + e_k G_k \\ P_k = \dfrac{1}{\lambda} P_{k-1} - \dfrac{1}{\lambda} G_k U P_{k-1} \end{cases} \quad (22)$$

wherein $\lambda$ is a forgetting factor, and e is the error.

Accordingly, using a recursive least squares algorithm, such as that described above, the coefficients for a polynomial characterizing a ring oscillator may be updated during a calibration procedure. Such calibrations may be performed at various times, such as on a system startup, at selected times during the life of the system/IC, responsive to large variations in the reference sensor 107 and the sensor 120 in MCC 105, and so forth. As such, voltage and temperature, based on ring oscillator frequencies, may be determined with a reasonable level of accuracy over the life of the system, while enabling the use of simple sensors having a small area footprint.

Figure 4:
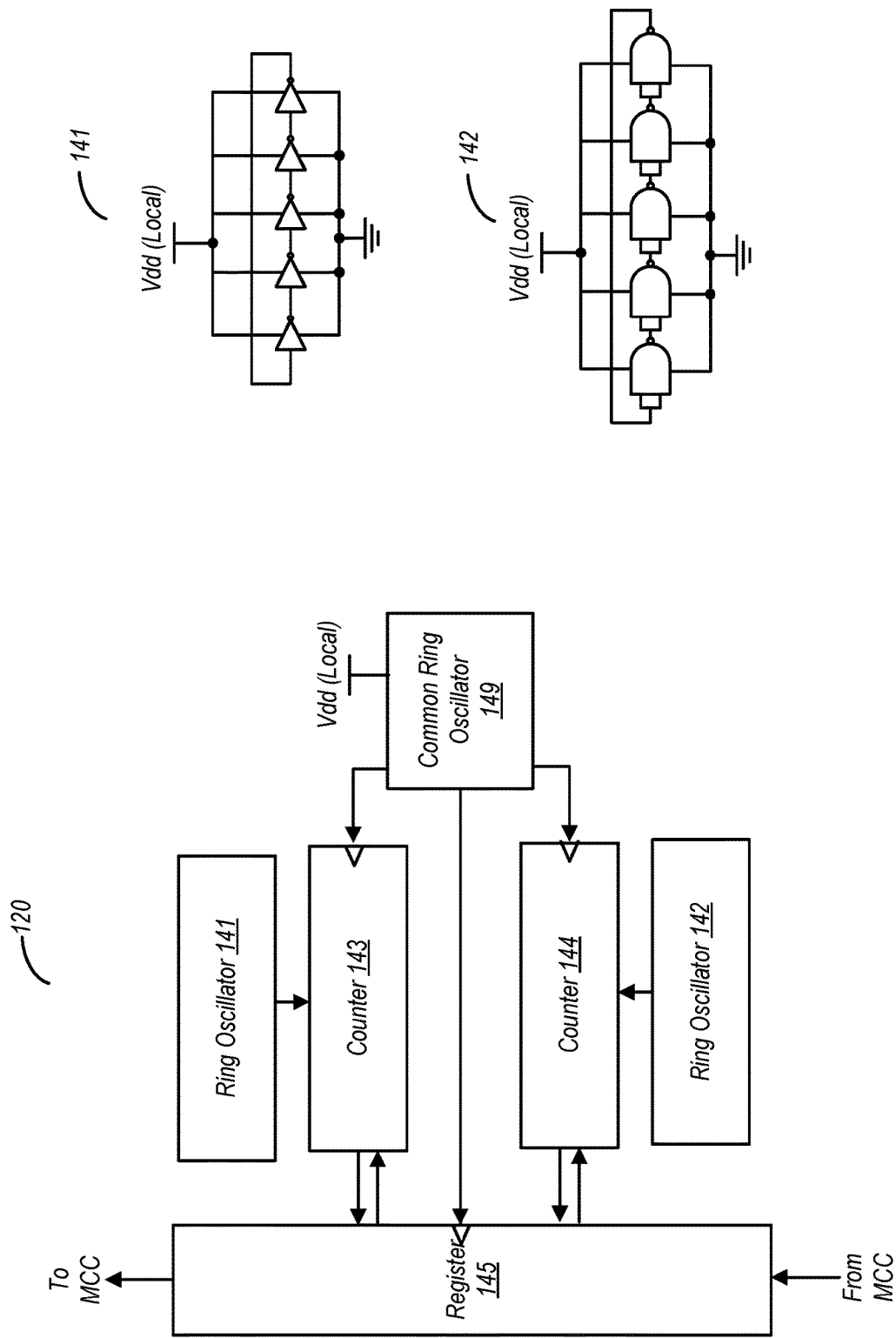
FIG. 4 is a block diagram of one embodiment of a sensor having two ring oscillators.

FIG. 4 is a diagram illustrating one embodiment of a sensor utilizing two ring oscillators. In the embodiment shown, sensor 120 includes ring oscillators 141 and 142, which may have different characteristics with respect to one another. In this particular embodiment, ring oscillator 141 is implemented using series-coupled inverters, while ring oscillator 142 is implemented using series-coupled NAND gates. Both of ring oscillators 141 and 142 are coupled to receive the same supply voltage, Vdd (Local), and are placed in close proximity to one another. However, due to the different circuit implementations, ring oscillators 141 and 142 may oscillate at different frequencies under identical operating conditions. In accordance with the discussion above, this may enable the respective frequencies produced by ring oscillators 141 and 142 to be the basis for solving for voltage and temperature at sensor 120.

Ring oscillators 141 and 142 are coupled to counters 143 and 144, respectively. These counters may be coupled to one or more tap points in their respectively coupled ring oscillators. During the taking of a measurement, counters 143 and 144 may track one or more count values that may in turn indicate the frequencies produced by ring oscillators 141 and 142, respectively. In some embodiments, each of counters 143 and 144 may include respective timers that track a run time for allowing counters to accumulate a count during a measurement. Other embodiments are possible and contemplated in which a separate timer coupled to both counters is provided.

In addition to having different circuit topologies with respect to one another, ring oscillators 141 and 142 may be designed to have different relationships to voltage and temperature with respect to one another. In one embodiment, one of ring oscillators 141 and 142 may be designed such that the frequency of its output signal is more sensitive to variations in voltage than the other one. Similarly, the other one of ring oscillators 141 and 142 may be designed such that the frequency of its output signal is more sensitive to variations in temperature than the other one. For the ring oscillator more sensitive to variations in voltage, its relationship to temperature may be non-linear. Similarly, for the ring oscillator that is more sensitive to temperature, its relationship to voltage may be non-linear. Nevertheless, the voltage and temperature values sensed by sensor 120 may be determined as discussed above by solving for these quantities based on the respective frequencies of the ring oscillator output signals.

Counters 143 and 144 are each coupled to register 145, which is a shift register in this particular embodiment. Using register 145, MCC 105 (of FIG. 1) may input information into the counters, and may also receive information therefrom. For example, information indicative of a run time for a counter to track a count value produced by the oscillation of a correspondingly coupled ring oscillator may be input into the counters, from MCC 105, via register 145. A start indication may also be input through register 145. From counters 143 and 144, register 145 may receive the count values produced during an actual measurement. In accordance with the embodiment shown in FIG. 1, these values may be serially shifted through metrology bus 13 to MCC 105 for use in computing the voltage and temperature values. Embodiments in which register 145 is directly coupled to an implementation of MCC 105 are also possible and contemplated.

Sensor 120 further includes a common ring oscillator 149 which, during operation, generates and provides a local clock signal to each of counters 143 and 144 as well as to register 145. Common ring oscillator 149 is generally coupled to provide the local clock signal exclusively to circuits within sensor 120, such as those mentioned here. Thus, the common ring oscillator 149 does not provide a clock signal to any circuit external to sensor 120. Furthermore, none of the circuits in sensor 120 are coupled to receive a clock signal from any source external to sensor 120. With respect to its physical location, common ring oscillator 149 is implemented on IC 10 (or more generally on an IC) in close proximity to the other circuitry of sensor 120.

Implementation of common ring oscillator 149 may be accomplished in any suitable manner. Generally speaking, common ring oscillator 149 is implemented in such a manner to have different characteristics than the other two ring oscillators within sensor 120. As noted above, one of ring oscillators 141 and 142 may be more sensitive to variations in voltage relative to the other ring oscillator. The frequency of the output signal of the voltage sensitive ring oscillator may thus be more strongly dependent on voltage, with the frequency being a function of a large and linear voltage slope. The other one of ring oscillators 142 may be more sensitive to variations in temperature than the other. Thus, the frequency of the output signal of the temperature sensitive ring oscillator is thus more strongly dependent on temperature, with the frequency being a function of a large and linear temperature slope. Meanwhile, the common ring oscillator 149 (which may be a free running oscillator in one embodiment) may be less sensitive to voltage and temperature variations than either one of ring oscillators 141 and 142.

With regard to the particular circuit topology, common ring oscillator 149 may be implemented using inverters, NAND gates, other types of inverting circuitry, and various combinations thereof. Various parameters of the transistors used in implementing the circuitry may also be varied to achieve the desired sensitivities of common ring oscillator 149. Furthermore, it is noted that common ring oscillator 149 is also coupled to receive the local supply voltage that is also provided to ring oscillators 141 and 142, as well as other circuitry of sensor 120. In some embodiments, common ring oscillator 149 may be substantially independent of voltage and temperature variations, and more generally, may be less sensitive to these variations than either of the other two ring oscillators used in the sensor.

Although one embodiment of a clock circuit in sensor 120 is implemented using common ring oscillator 149, it is noted that other types of circuits capable of generating a clock signal may be used in other embodiments. Generally speaking, any type of circuit suitable for generating a periodic signal suitable for use as a clock signal can be used to implement a local clock circuit in various embodiments of sensor 120.

Including a local clock circuit such as common ring oscillator 149 in sensor 120 may provide a number of advantages. The lack of any need to route an external clock signal may provide more flexibility in placing instances of sensor 120 on an IC, thereby simplifying the layout process. Since common ring oscillator 149 is located in close proximity to the counters and other circuits in sensor 120, the local clock signal may be less susceptible to jitter and other problems that may arise from distributing a single clock signal over longer distances. Furthermore, generating and providing the clock signal locally within each instance of sensor 120 may make these sensors less susceptible to tampering.

Figure 5:
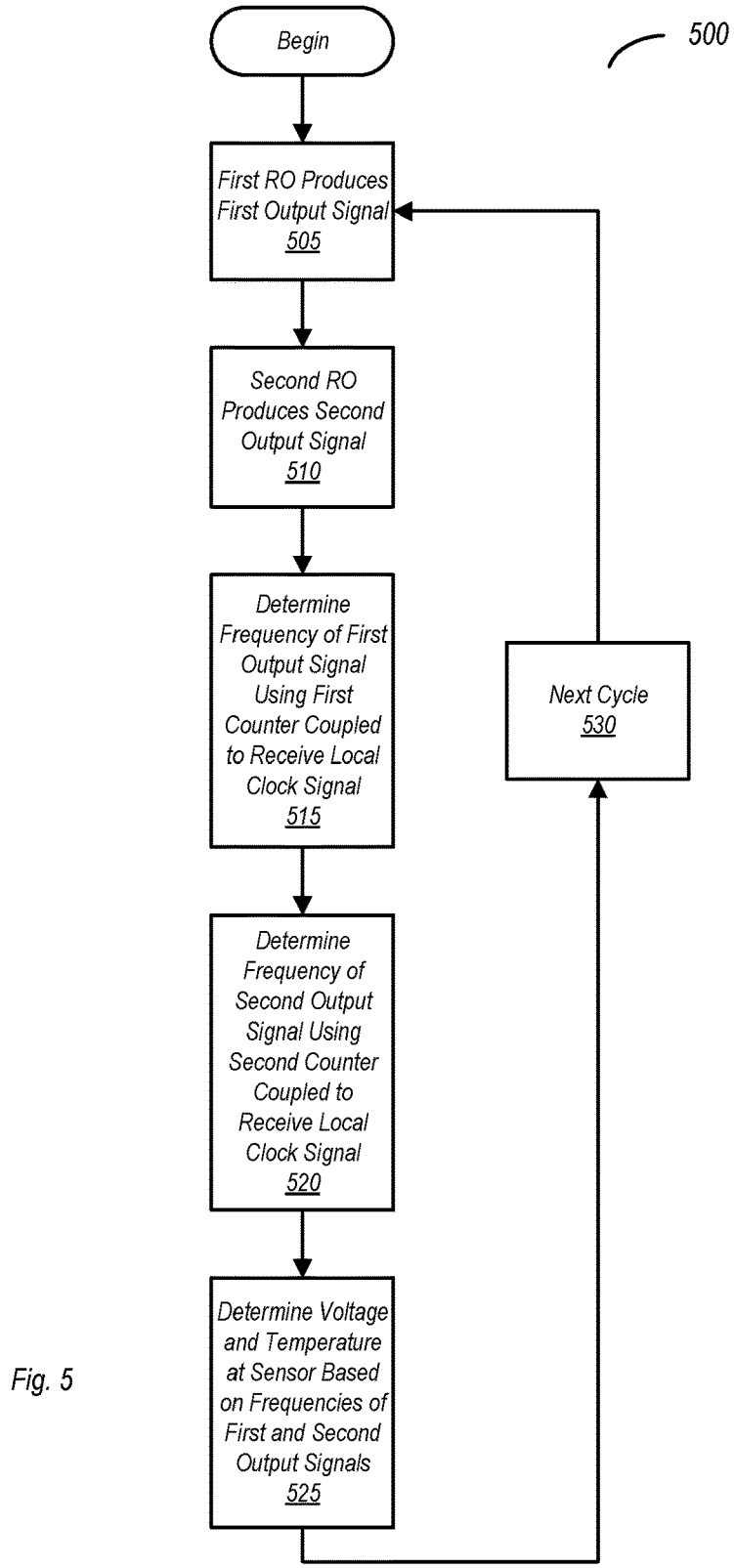
FIG. 5 is a schematic diagram of one embodiment of a local clock circuit implemented in a sensor employing two ring oscillators for voltage and temperature sensing.

FIG. 5 is a flow diagram of one embodiment of a method for determining a voltage and a temperature from a sensor. Method 500 may be implemented using any of the embodiments of a sensor circuit as disclosed herein, in conjunction with any circuitry or other mechanism to solve for voltage and temperature based on respective ring oscillator frequencies.

Method 500 begins with the first ring oscillator of a sensor producing a first output signal (block 505), while a second ring oscillator produces a second output signal (block 510). The respective output signals produced by the first and second ring oscillators each have respective frequencies that are dependent on operating conditions, namely voltage and temperature. In some embodiments, the frequency of one of the output signals may have a linear relationship to a voltage received by the sensor, while the frequency of the other one of the output signals has a linear relationship to the temperature of the sensor. The two ring oscillators are implemented in close proximity to one another, and thus operate under substantially the same conditions.

The first and second ring oscillators are coupled to first and second counters, respectively, each which are coupled to receive a locally generated clock signal, as discussed above. Method 600 further includes determining the frequency of the first output signal using the first counter (block 515), and determining the frequency of the second output signal using the second counter (block 520). After determining the respective frequencies of the first and second output signals, the voltage and temperature sensed by the sensor are determined based on these frequencies (block 525). The determination of the sensed voltage and temperature may be performed, as previously discussed, using characteristic polynomials and solving for voltage and temperature. Method 500 then proceeds to the next cycle (block 530) and repeats.

Figure 6:
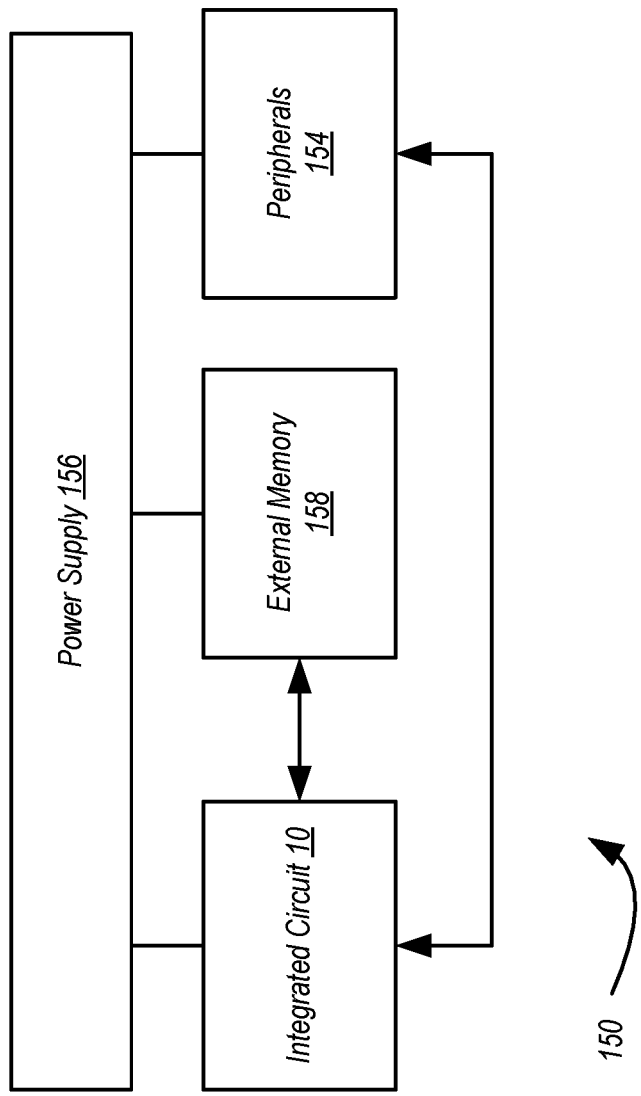
FIG. 6 is a block diagram of one embodiment of an example system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
   a sensor circuit configured to sense a local voltage and a local temperature, wherein the sensor circuit includes:
   a first ring oscillator having a first circuit topology;
   a first counter coupled to receive a first output signal from the first ring oscillator, wherein the first counter is configured to determine a frequency of the first output signal;
   a second ring oscillator having a second circuit topology different from the first circuit topology;
   a second counter coupled to receive a second output signal from the second ring oscillator, wherein the second counter is configured to determine a frequency of the second output signal;
   a local clock circuit configured to provide a clock signal exclusively to circuitry within the sensor circuit including the first and second counters; and
   a shift register coupled to receive the clock signal from the local clock circuit, and further coupled to receive a first count value from the first counter and a second count value from the second counter.

2. The circuit as recited in claim 1, wherein the first count value corresponds to a frequency of the first output signal and the second count value corresponds to a frequency of the second output signal.

3. The circuit as recited in claim 1, wherein the shift register is coupled to a bus, wherein the sensor circuit is configured to convey information indicative of the frequency of the first output signal and the frequency of the second output signal to a control circuit via the bus.

4. The circuit as recited in claim 1, wherein the local clock circuit includes a third ring oscillator.

5. The circuit as recited in claim 1, wherein a frequency of the first output signal has a relationship to a voltage received by the sensor circuit that is different than that of the second output signal, and wherein a frequency of the first output signal has a relationship to a temperature received by the sensor circuit that is different than that of the second output signal.

6. The circuit as recited in claim 1, wherein the first ring oscillator is implemented using a plurality of series-coupled inverters, and wherein the second ring oscillator is implemented using a plurality of series-coupled NAND gates.

7. The circuit as recited in claim 1, wherein each of the first and second ring oscillators are characterized by first and second polynomials, respectively, wherein, during operation of an integrated circuit in which the sensor circuit is implemented, a voltage and a temperature sensed by the sensor circuit is determined by solving for a voltage and temperature using respective frequencies of the first and second output signals and the first and second polynomials.

8. The circuit as recited in claim 1, wherein the sensor circuit is implemented within a functional circuit block of an integrated circuit, wherein each of the first and second ring oscillators are coupled to receive a supply voltage that is received by circuitry of the functional circuit block.

9. An integrated circuit comprising:
   a plurality of functional circuit blocks each including functional circuitry; and
   a plurality of sensors, wherein each of the plurality of functional circuit blocks includes at least one of the plurality of sensors implemented therein, and wherein each of the plurality of sensors includes:
   a first ring oscillator having a first circuit topology;
   a first counter coupled to receive a first output signal from the first ring oscillator;
   a second ring oscillator having a second circuit topology different from the first circuit topology;
   a second counter coupled to receive a second output signal from the second ring oscillator;
   a local clock circuit configured to provide a clock signal exclusively to circuitry within its respective one of the plurality of sensors, the circuitry including the first and second counters;
   a shift register coupled to receive a first count value from the first counter and a second count value from the second counter, wherein the shift register is coupled to receive the clock signal from the local clock circuit.

10. The integrated circuit as recited in claim 9, wherein the first count value corresponds to a frequency of the first output signal and the second count value corresponds to a frequency of the second output signal, and wherein the integrated circuit further includes a control circuit and a bus coupled to both the control circuit and the shift register, wherein the sensor circuit is configured to convey information indicative of the frequency of the first output signal and the frequency of the second output signal from the shift register to the control circuit via the bus.

11. The integrated circuit as recited in claim 9, wherein the local clock circuit in each of the plurality of sensors includes a third ring oscillator.

12. The integrated circuit as recited in claim 9, wherein a frequency of the first output signal has a relationship to a voltage received by the sensor circuit that is different than a frequency of the second output signal, and wherein the frequency of the second output signal has a relationship to temperature of the sensor circuit that is different than the frequency of the first output signal.

13. The integrated circuit as recited in claim 9, wherein the first ring oscillator is implemented using a plurality of series-coupled inverters, and wherein the second ring oscillator is implemented using a plurality of series-coupled NAND gates.

14. The integrated circuit as recited in claim 9, wherein each of the first and second ring oscillators in each of the plurality of sensors are characterized by corresponding first and second polynomials, respectively, and wherein, during operation of the integrated circuit, a voltage and a temperature sensed by each of the plurality of sensors is determined by a control circuit solving for a voltage and temperature using respective frequencies of the first and second output signals and the first and second polynomials.

15. The integrated circuit as recited in claim 9, wherein each of the plurality of sensors is coupled to receive a supply voltage that is provided to each of the circuits in the one of the plurality of functional circuit blocks in which it is implemented.

* * * * *